(12) United States Patent
Chou et al.

(10) Patent No.: US 9,460,949 B2
(45) Date of Patent: Oct. 4, 2016

(54) ULTRA-LOW OXYGEN AND HUMILITY LOADPORT AND STOCKER SYSTEM

(71) Applicant: Taiwan Semiconductor Manufacturing Company Limited, Hsin-Chu (TW)

(72) Inventors: You-Hua Chou, Hsinchu (TW); Chih-Wei Huang, Jhudong Township (TW); Kuo-Sheng Chuang, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 351 days.

(21) Appl. No.: 14/052,231

(22) Filed: Oct. 11, 2013

(65) Prior Publication Data
US 2015/0101703 A1    Apr. 16, 2015

(51) Int. Cl.
*B65B 31/00* (2006.01)
*H01L 21/673* (2006.01)

(52) U.S. Cl.
CPC .............................. *H01L 21/67393* (2013.01)

(58) Field of Classification Search
CPC .................. H01L 21/67389; H01L 21/67393
USPC ................................................ 141/4, 39, 66
See application file for complete search history.

(56) References Cited

U.S. PATENT DOCUMENTS

| | | | |
|---|---|---|---|
| 5,879,458 A * | 3/1999 | Roberson, Jr. .... | H01L 21/67017 118/715 |
| 7,203,563 B2 | 4/2007 | Chang et al. | |
| 8,060,252 B2 | 11/2011 | Gage et al. | |
| 8,832,960 B2 * | 9/2014 | Kim .................... | F04F 99/00 118/696 |
| 2006/0288664 A1 * | 12/2006 | Okabe ............... | H01L 21/67393 53/510 |
| 2007/0297884 A1 | 12/2007 | Jung | |
| 2010/0116709 A1 | 5/2010 | Liu | |
| 2010/0143082 A1 | 6/2010 | Wang et al. | |
| 2012/0083918 A1 * | 4/2012 | Yamazaki ......... | H01L 21/67775 700/112 |
| 2013/0121851 A1 * | 5/2013 | Kim .................. | H01L 21/67393 417/65 |
| 2013/0230375 A1 | 9/2013 | Tung et al. | |

OTHER PUBLICATIONS

Liao, Da-Yin, "Automation and Integration in Semiconductor Manufacturing", pp. 39-57, Apr. 1, 2010, www.intechopen.com.

* cited by examiner

*Primary Examiner* — Jason K Niesz
(74) *Attorney, Agent, or Firm* — Cooper Legal Group, LLC (57) ABSTRACT

One or more apparatuses for adjusting at least one of an oxygen content or a water content in a pod and methods of their use are provided, where one or more semiconductor wafer are selectively stored within a storage chamber of the pod. The apparatus comprises the pod and a pipeline. The pod comprises the storage chamber and a port. The port comprises a receptacle having a first opening and a constraining ring proximate the first opening. The pipeline comprises a pipe, a diffuser attached to a first end of the pipe and a controller attached to a second end of the pipe.

20 Claims, 11 Drawing Sheets

ULTRA-LOW OXYGEN AND HUMIDITY LOADPORT AND STOCKER SYSTEM

BACKGROUND

Automated Material Handling Systems (AMHS) have been widely used in semiconductor fabrication facilities to automatically handle and transport groups or lots of wafers between various processing machines used in chip manufacturing. A fabrication facility includes one or more floors having a plurality of process bays including processing tools and wafer staging equipment which are interconnected by the AMHS.

A bay includes a wafer stocker, which includes multiple bins for temporarily holding and staging wafer carriers during the fabrication process. The wafer carriers include front opening unified pods (FOUPs) which hold, inter alia, larger 300 mm (12 inch) wafers. A stocker generally includes a single mast robotic lift or crane for lifting, inserting, and retrieving wafer carriers from the bins. The stocker generally holds multiple FOUPs in preparation for transporting a FOUP to the loadport of a processing tool.

A semiconductor fabrication facility includes numerous types of automated and manual vehicles for moving and transporting wafer carriers throughout the fabrication facility during the manufacturing process. A vehicle handling system automatically moves the vehicles that carry and transport wafer carriers, such as FOUPs from a processing tool or a stocker to the loadport of another tool or other apparatus.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more apparatuses for adjusting at least one of an oxygen content or a water content in a pod and methods of their use are provided herein.

Figure 1:
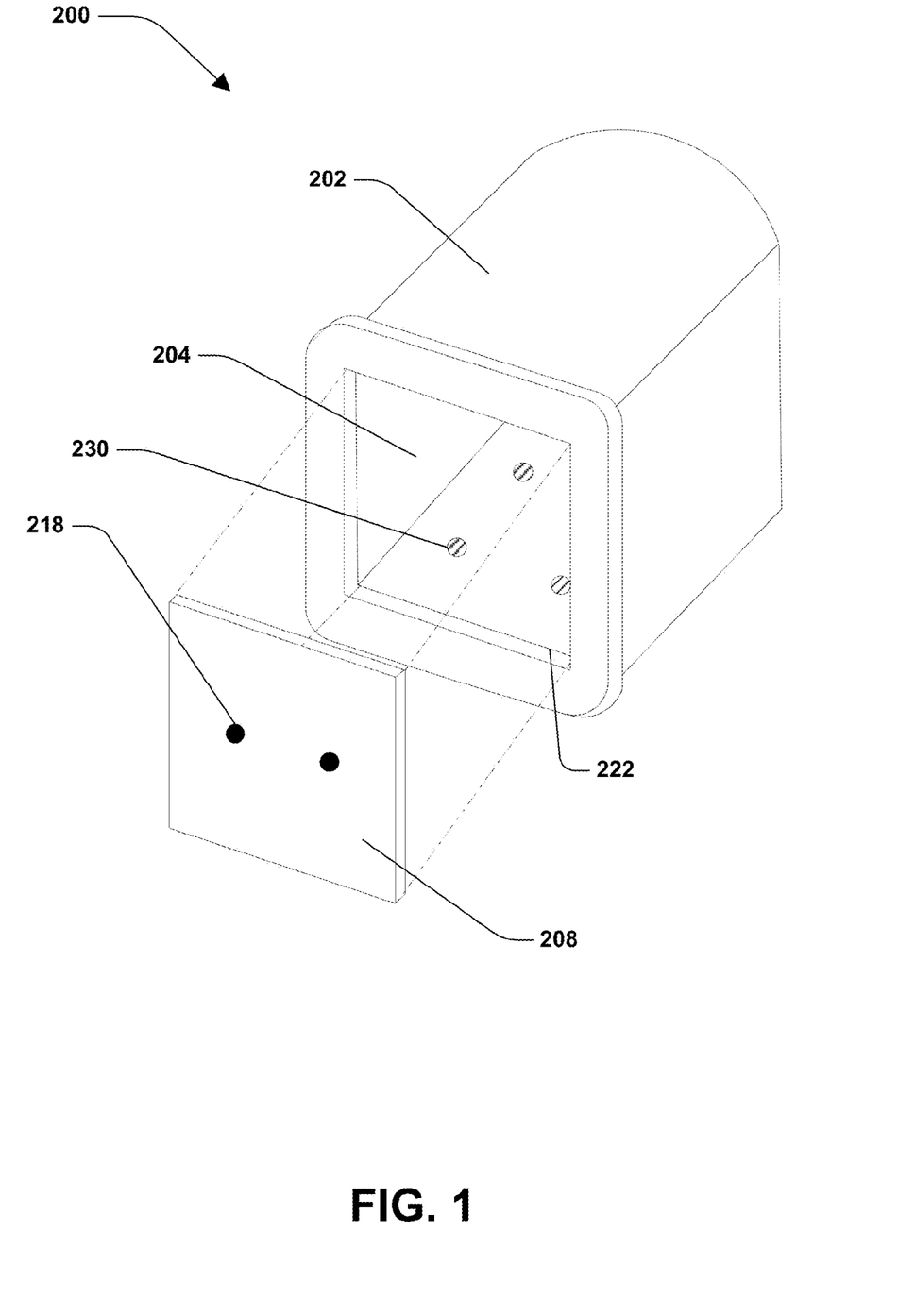
FIG. 1 is an illustration of a pod, according to some embodiments.

Referring to FIG. 1, illustrated is a pod 200. In some embodiments, the pod 200 is a front opening unified pod (FOUP). In some embodiments, the pod 200 includes a storage chamber 202 having a side wall surface 222 defining an opening 204 at one side of the storage chamber 202. In some embodiments, the pod 200 includes a port 230. In some embodiments, the port 230 is in the base of the pod 200. In some embodiments, a pod door 208 that includes a key assembly 218 is fitted to the storage chamber 202 at the opening 204 so as to provide ingress and egress to the storage chamber 202. In some embodiments, the pod door 208 is open and a wafer is inserted into the storage chamber 202 through the opening 204. In some embodiments, the pod door 208 is closed and the wafer is sealed within the storage chamber 202 by the pod door 208. In some embodiments, the storage chamber 202 is made of a transparent material so that the state of the wafer inside the storage chamber 202 is observable. In some embodiments, the storage chamber 202 is made of at least one of plastic or tempered glass.

In some embodiments, the storage chamber 202 includes a low outgassing material. In some embodiments, a low outgassing material includes a material with an outgassing rate of below $4.5 \times 10^{-9}$ torr-L/sec-cm$^2$. In some embodiments, the storage chamber 202 includes at least one of aluminum or teflon. In some embodiments, the storage chamber 202 includes Aluminum 5083-O, In some embodiments, the low outgassing material reduces leaching or contamination of the wafer during at least one of processing, transportation or storage of the wafer.

Figure 2:
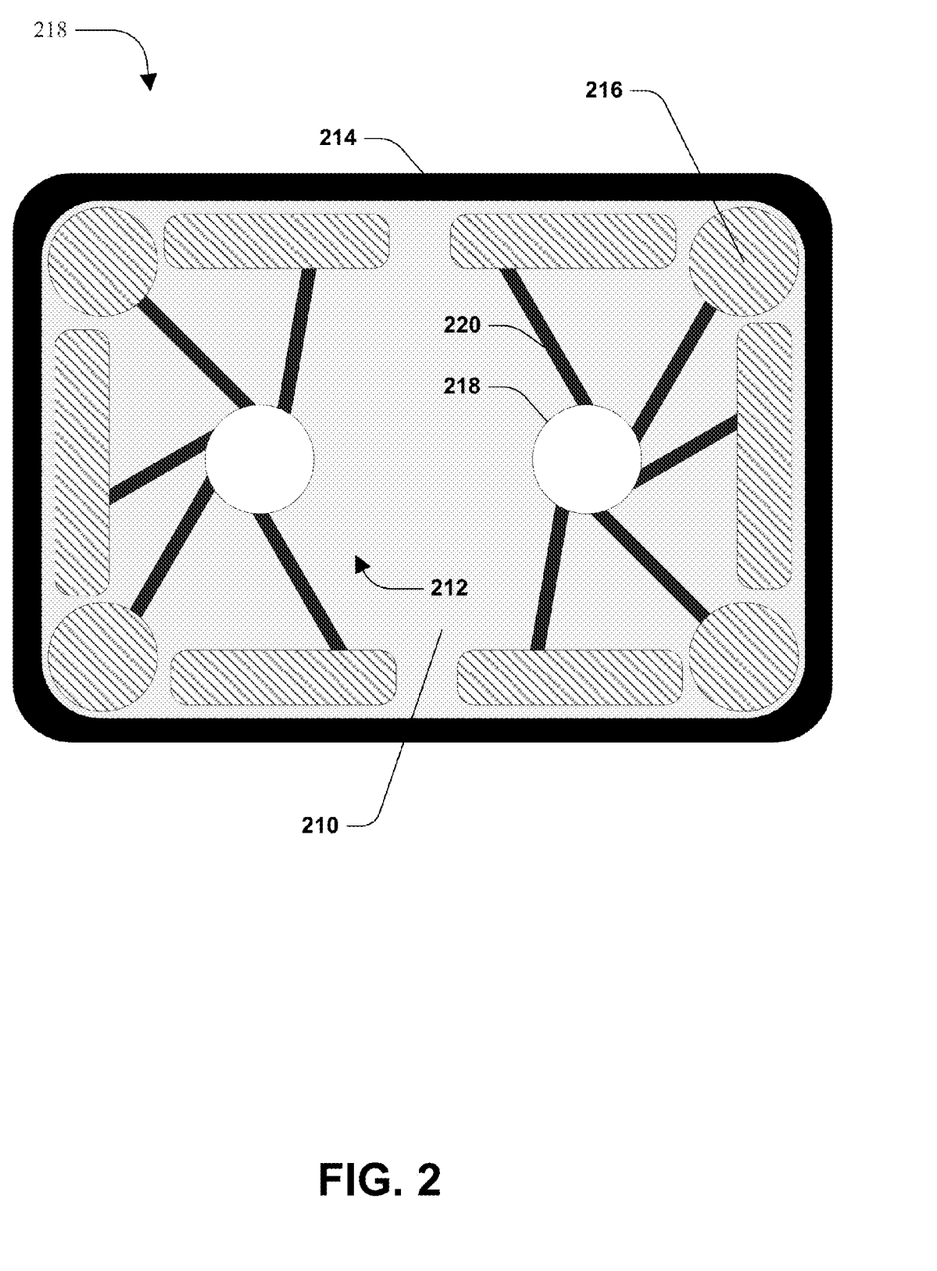
FIG. 2 is an illustration of a pod door, according to some embodiments.

Referring to FIG. 2, an illustration of the pod door 208 is provided. In some embodiments, the pod door 208 includes at least one of a door locking mechanism 212, a door body 210 or a seal band 214. In some embodiments, the door locking mechanism 212 is attached to the door body 210. In some embodiments, the seal band 216 is positioned around at least one of the door body 210 or the door locking mechanism 212. In some embodiments, the door body 210 includes at least one of a resin, polymer or metal. in some embodiments, the door body 210 includes a low outgassing material as described above.

Figure 3:
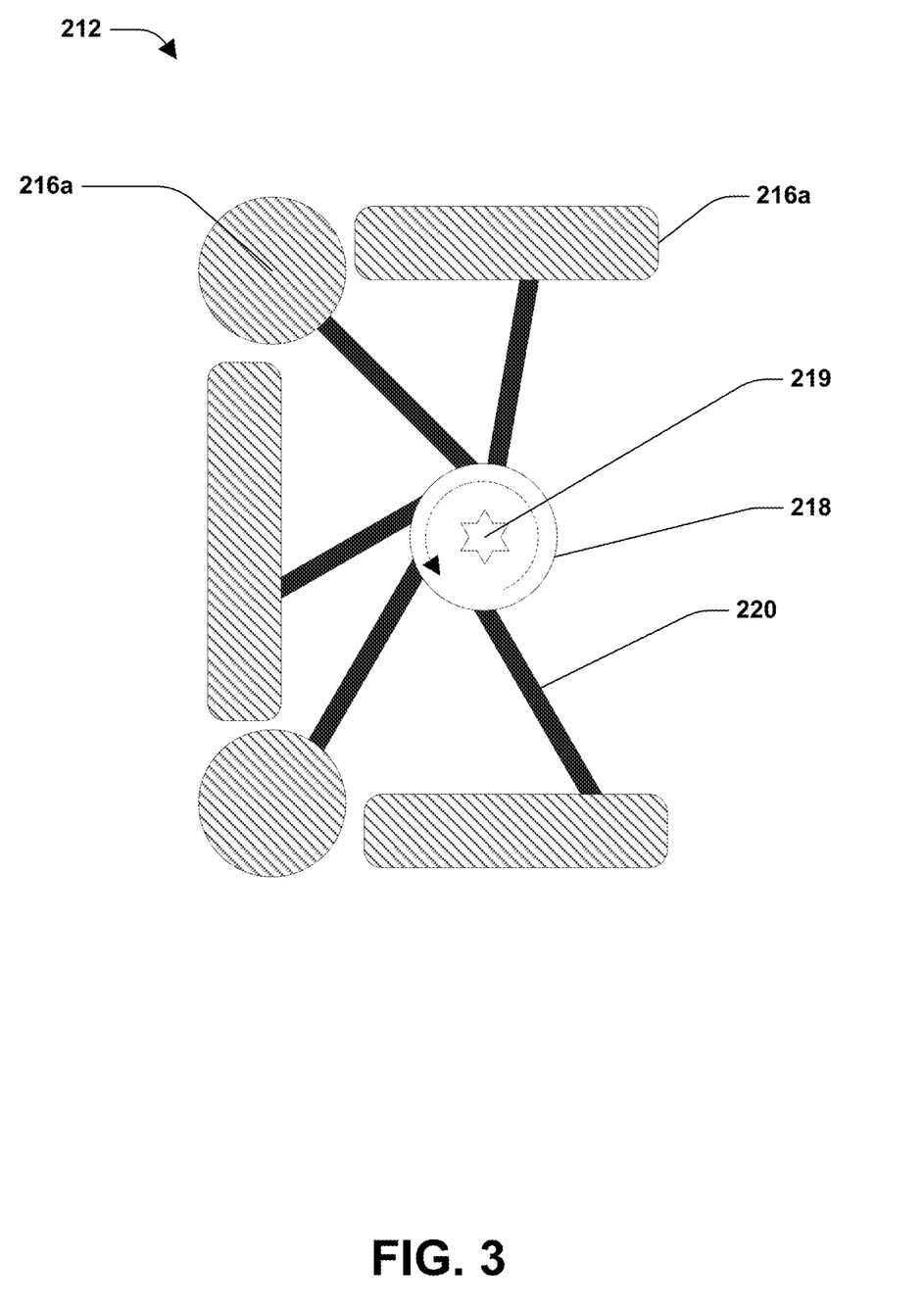
FIG. 3 is an illustration of a locking mechanism, according to some embodiments.

In some embodiments, the door locking mechanism 212 includes at least one of a pressure applicator 216, the key assembly 218 or a connector-rod 220, as illustrated in FIG. 3. In some embodiments, the connector-rod 220 connects the key assembly 218 to the pressure applicator 216. In some embodiments, pressure applicator 216 includes at least one of a pressure applicator rod 216a or pressure applicator ball 216b. In some embodiments, the pressure applicator 216 is spaced along the seal band 214. In some embodiments, more than one pressure applicator 216 is spaced along the seal band 214. In some embodiments, the pressure applicator rod 216a is spaced along a side of the seal band 214 and the pressure applicator ball 216b is positioned in a corner of the seal band 214 or at a corner of the pod door 208. In some embodiments, the pressure applicator 216 includes a metal material. In some embodiments, the pressure applicator 216 includes a polymer coating.

Figure 4:
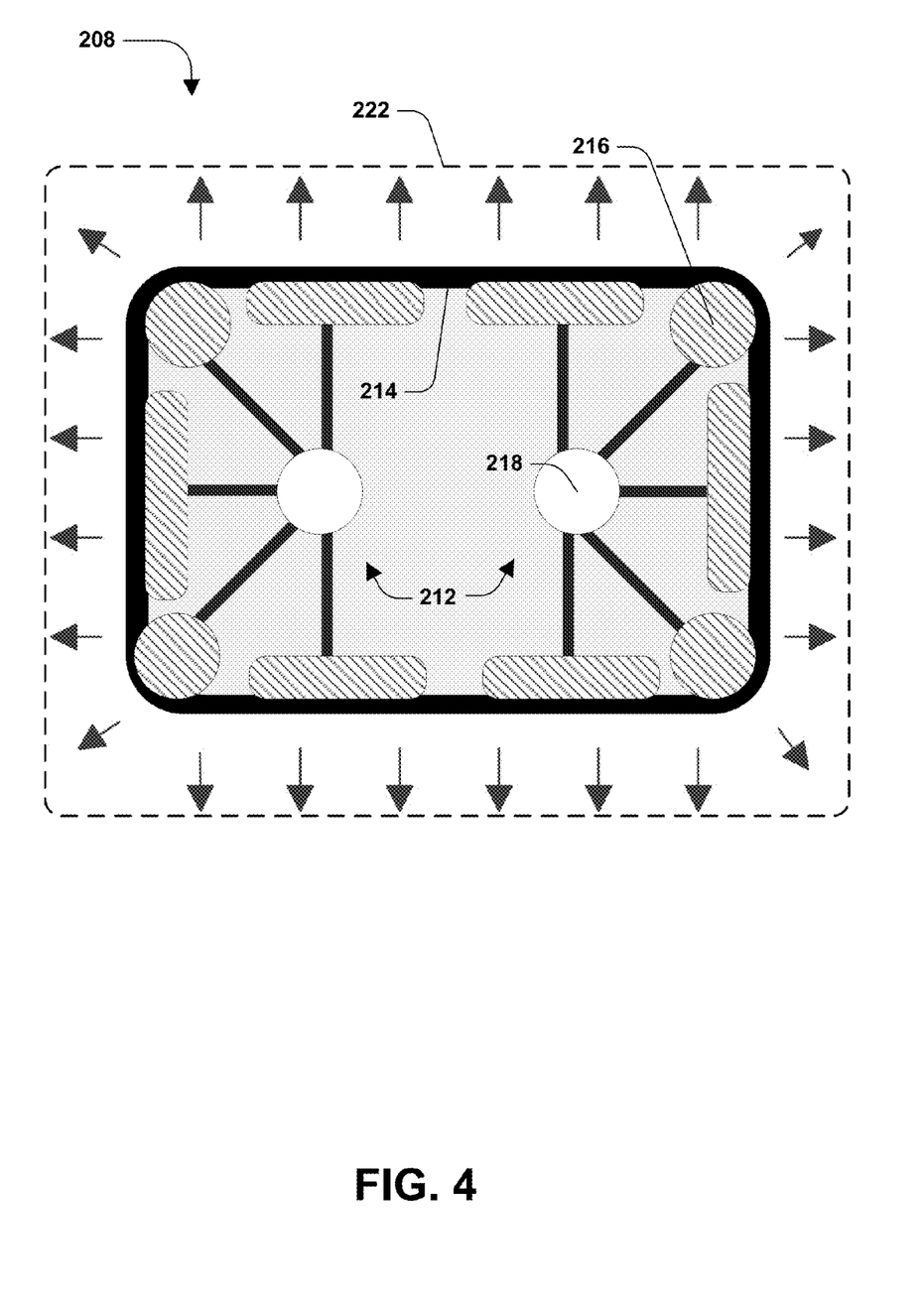
FIG. 4 is an illustration of a pod door, according to some embodiments.

In some embodiments, the pod door 208 includes two locking mechanisms 212, as illustrated in FIG. 2 and FIG. 4. In some embodiments, the first door locking mechanism 212 is located on a first side of the pod door 208 and a second door locking mechanism 212 is located on a second side of the pod door 208.

In some embodiments, the key assembly 218 receives a key 219, as illustrated in FIG. 3, to actuate the locking mechanism 212. In some embodiments, the locking mechanism 212 is actuated by turning the key 219 that is inserted into the key assembly 218 counter clockwise causing the connector-rod 220 to drive the pressure applicator 216 outwards towards the seal band 214.

Referring to FIG. 4, an illustration of the pod door 208 with the locking mechanism 212 engaged is provided. In some embodiments, the key assembly 218 is operatively connected to the pressure applicator 216 by the connector-rod 220 and is actuated to cause the pressure applicator 216 to drive the seal band 214 outward towards the sidewall surface 222 of the storage chamber 202. In some embodiments, the locking mechanism 212 engages the seal band 214 to cause a seal to be formed by the seal band contacting or engaging the sidewall surface 222, thus enclosing the storage chamber 202. In some embodiments, the seal is airtight or substantially airtight. In some embodiments, the key assembly engages the seal band 214 to seal and unseal the pod door 208 to and from the sidewall surface 222 defining the opening 204 in the storage chamber 202. In some embodiments, the pod door 208 is sealed for storage. In some embodiments, the pod door 208 is sealed while being transferred for processing. In some embodiments, the pod door 208 is open while in a loadport for processing.

Figure 5:
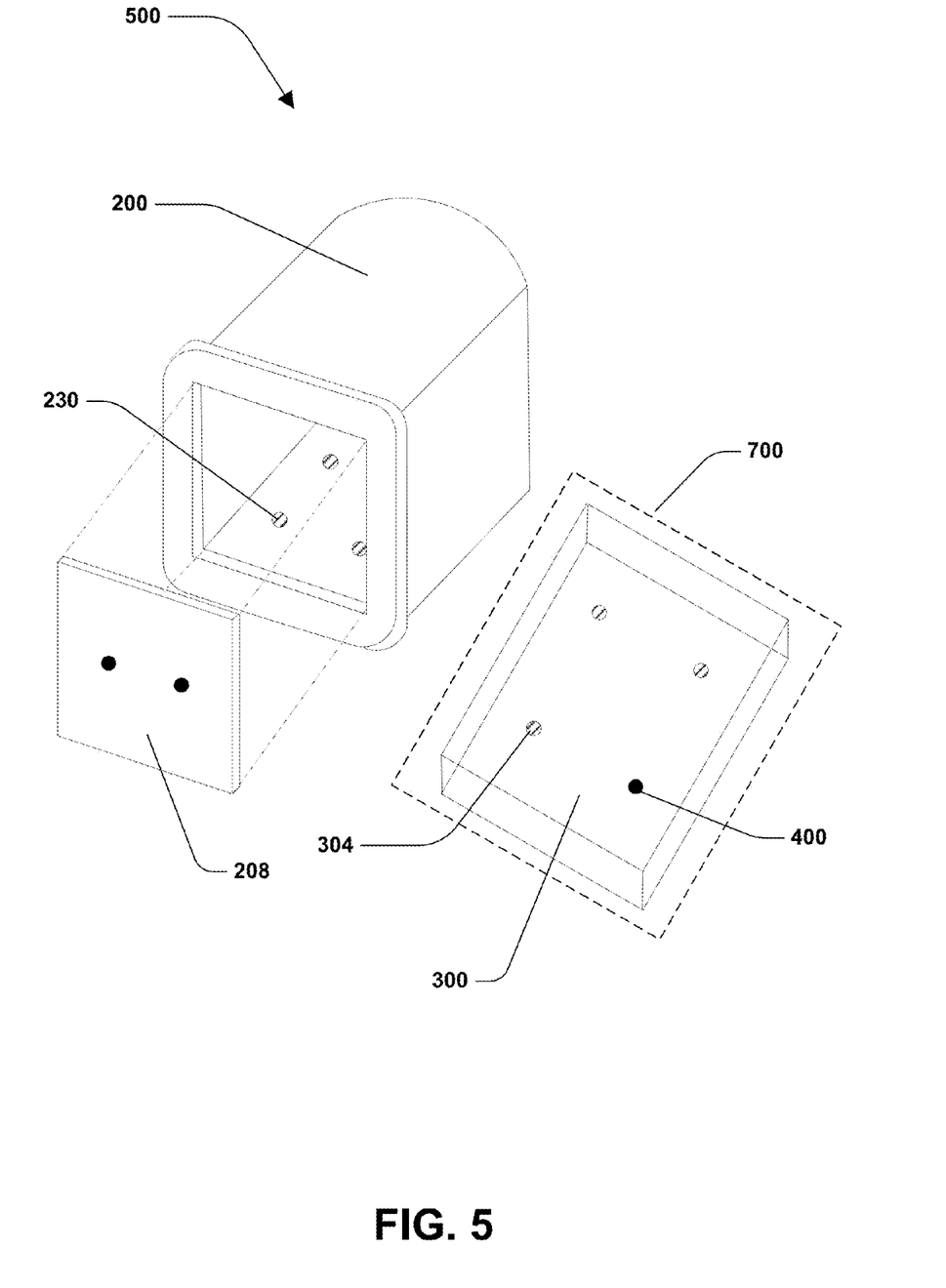
FIG. 5 is an illustration of an apparatus, according to some embodiments.

Referring to FIG. 5, an illustration of an apparatus 500 is provided. In some embodiments, the apparatus 500 includes at least one of a pod 200 or a pipeline 400. In some embodiments, the pipeline 400 is coupled to a pod dock 300 through a pipeline channel 304. In some embodiments, the pipeline 400 is positioned below the pod dock 300. In some embodiments, the pod dock 300 is configured as at least one of a loadport 700 or a stocker (not pictured). In some embodiments, the pod dock 300 is configured to receive the pod 200, such as where the pod 200 sits or is seated within the pod dock 300.

Figure 6:
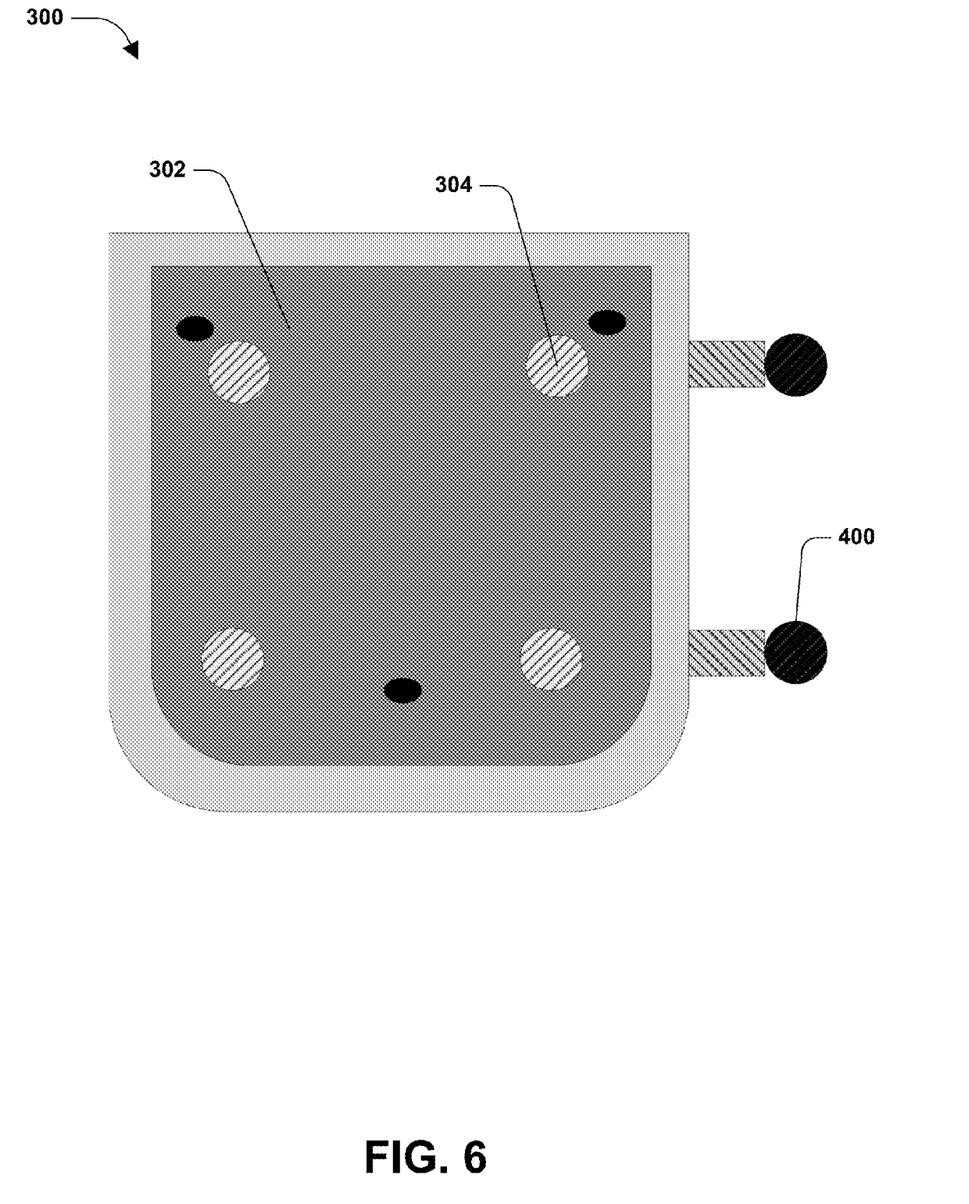
FIG. 6 is an illustration of a pod dock, according to some embodiments.

Referring to FIG. 6, an illustration of a pod dock 300 is provided. In some embodiments, the pod dock 300 is dimensioned to receive the pod 200. In some embodiments, the pod dock 300 includes a pod docking plate 302. In some embodiments, the pod dock 300 includes a pipeline channel 304. In some embodiments, the pipeline channel 304 runs through the pod docking plate 302. In some embodiments, a pipeline 400 is inserted through the pipeline channel 304. In some embodiments, the pipeline 400 retracts below the pod dock 300 and is positioned in line or co-axial with the pipeline channel 304.

Figure 7:
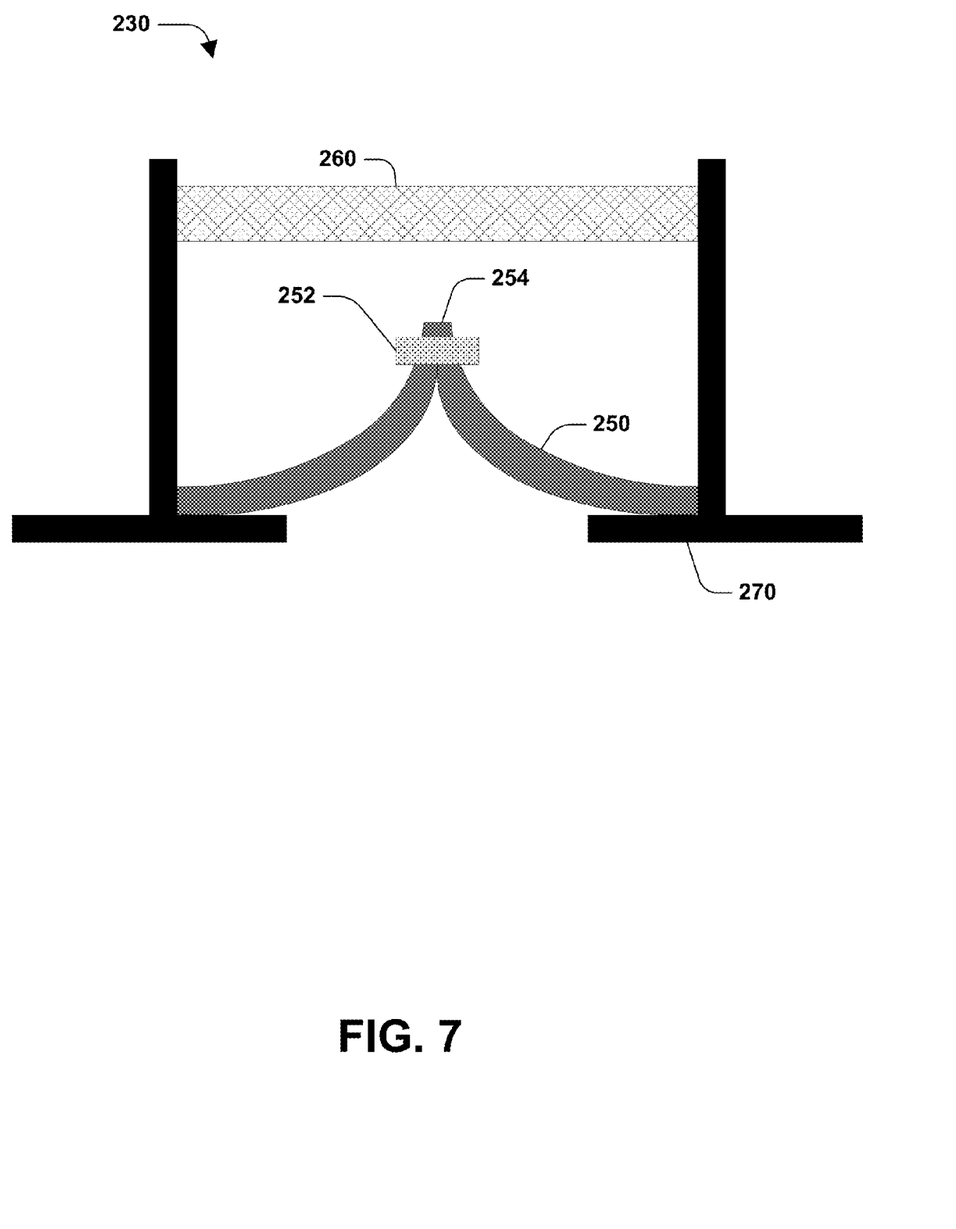
FIG. 7 is an illustration of a port, according to some embodiments.
Figure 9:
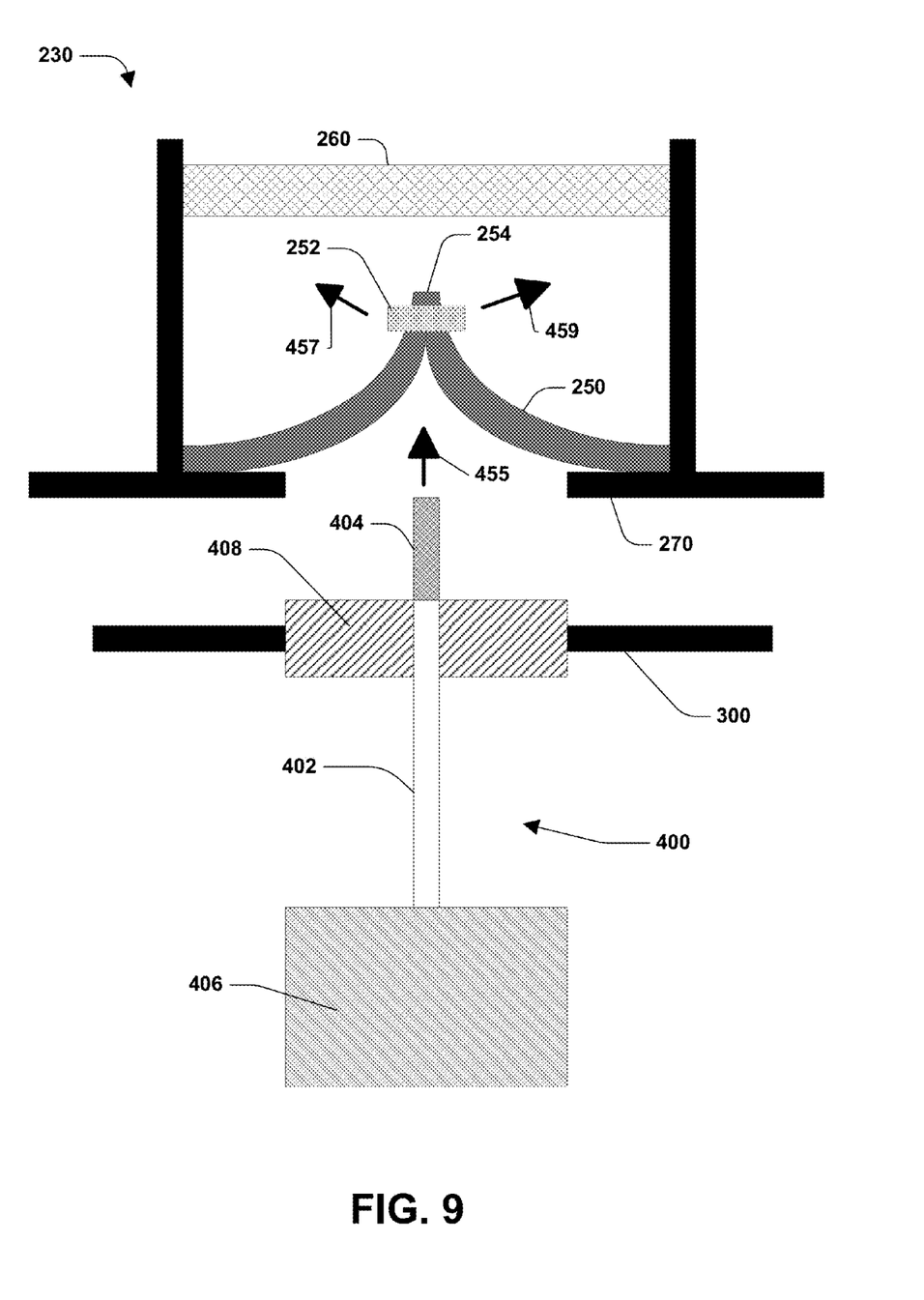
FIG. 9 is an illustration of pipeline going into a port, according to some embodiments.

Referring to FIG. 7 and FIG. 9, illustrated is a port 230 and a filter 260 of the pod 200. In some embodiment, the port 230 includes at least one of a receptacle 250 or a constraining ring 252. In some embodiments, the receptacle 250 includes or defines an opening 254. In some embodiments, the opening 254 provides access to an interior space within the storage chamber 202. In some embodiments, the constraining ring 252 is proximate to the first opening 254. In some embodiments, the constraining ring is configured to form a seal at the receptacle 250 by constraining the first opening 254. In some embodiments, the seal inhibits the ambient atmosphere from entering the pod 200, or the interior space within the pod where wafers are stored. In some embodiments, the constraining ring 252 expands upon insertion of a pipeline 400 through the first opening 254. In some embodiments, at least one of the receptacle 250 or the constraining ring 252 expands in the direction illustrated by at least one of a first arrow 457 or a second arrow 459. In some embodiments, at least one of the receptacle 250 or the constraining ring 252 includes a polymer. In some embodiments, at least one of the receptacle 250 or the constraining ring 252 includes silicon.

In some embodiments, the pod 200 includes a filter 260. In some embodiments, the filter 260 includes a high-efficiency particulate air (HEPA) filter. In some embodiments, the filter 260 is placed between the receptacle 250 and the interior space within the storage chamber 202. In some embodiments, the filter 260 inhibits particulates or other contaminates from entering the storage chamber 202. In some embodiments, the filter 260 removes about 99.97% of particles that have a size of at least about 0.3 micrometers.

Figure 8:
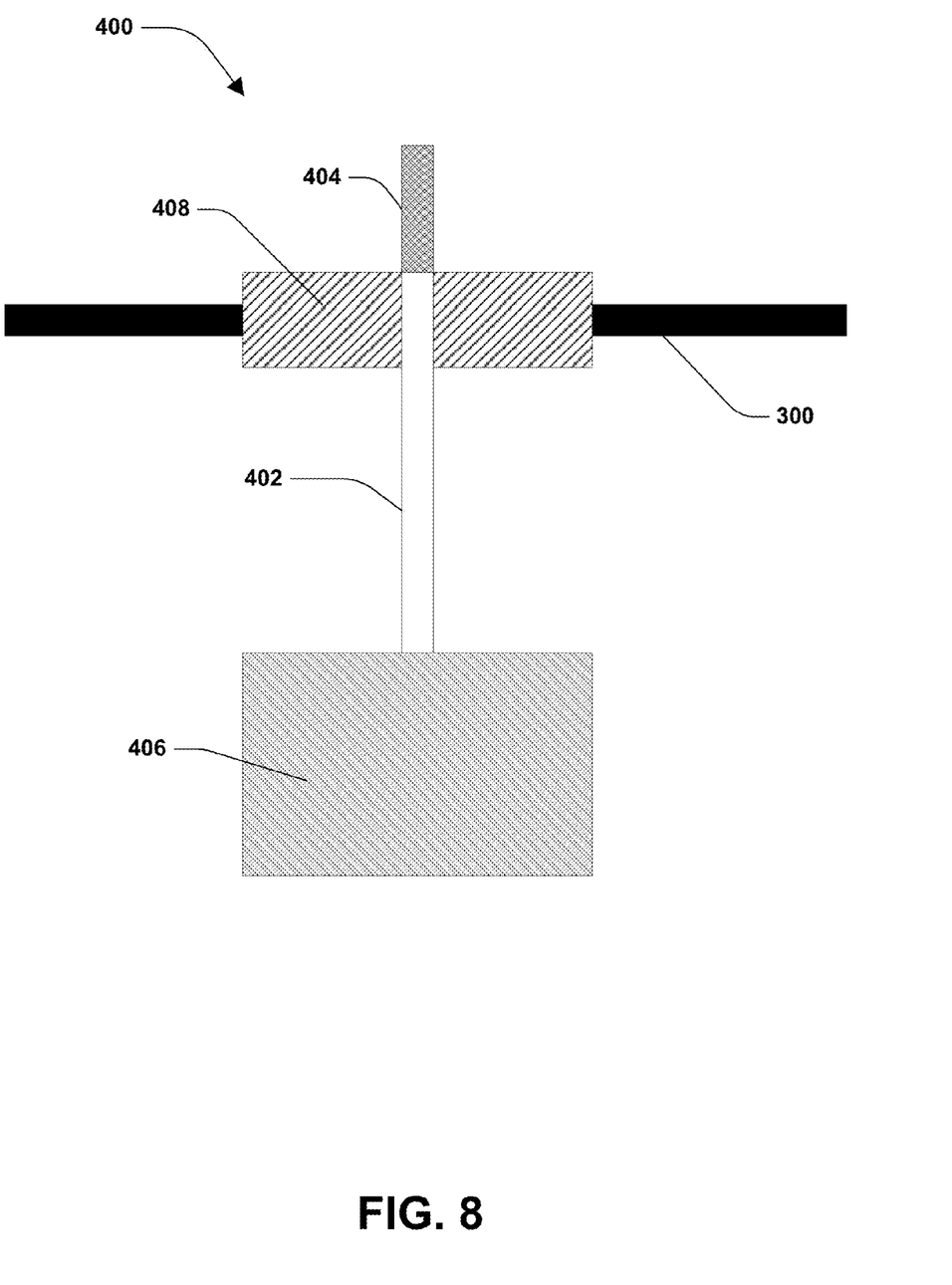
FIG. 8 is an illustration of a pipeline, according to some embodiments.

Referring to FIG. 8 and FIG. 9, a pipeline 400 is provided. In some embodiments, the pipeline 400 includes at least one of a pipe 402, a diffuser 404 or a controller 406. In some embodiments, the diffuser 404 is attached to or comprised within a first end of the pipe 402. In some embodiments, a controller 406 is attached to a second end of the pipe 402. In some embodiments, the pipeline 400 is dimensioned to be inserted into the port 230 of the pod 200. In some embodiments, the pipeline 400 is inserted into the port 230 in a direction illustrated by a third arrow 455. In some embodiments, the receptacle 250 forms a seal around the pipeline 400 when the pipeline 400 is inserted into the port 230 through the opening 254.

In some embodiments, the diffuser 404 includes at least one of a filter or a membrane. In some embodiments, the diffuser 404 includes at least one of a metal or a polymer material. In some embodiments, the diffuser 404 includes stainless steel. In some embodiments, the diffuser 404 creates a 360 degree circular flow of gas at least one of exiting or entering the diffuser 404. In some embodiments, the diffuser 404 is dimensioned to be received by the receptacle 250 of pod 200, as illustrated in FIG. 9. In some embodiments, the diffuser 404 is dimensioned such that all or substantially all of the diffuser 404 passes through the opening 254 of the receptacle 250 to be situated within an interior space within the pod 200. In some embodiments, the pipeline 400 includes a stopper 408. In some embodiments, the stopper 408 is located between the diffuser 404 and the controller 406 but proximate the diffuser 404. In some embodiments, the stopper 408 surrounds the pipe 402. In some embodiments, the stopper 408 is dimensioned to form a seal below the receptacle 250 when the pipeline 400 is inserted in the port 230. In some embodiments, the stopper 408 forms a seal with a pod base 270. In some embodiments, the stopper includes a polymer material. In some embodiments, the stopper includes silicone.

In some embodiments, the controller 406 includes at least one of a mass flow controller, a vacuum controller, an oxygen detector or a water detector. In some embodiments, the controller 406 is configured to detect at least one of an oxygen content or a water content in the storage chamber 202. In some embodiments, the pipe 402 is hollow so that gas, oxygen, water, etc. flow from the diffuser 404 through the pipe 402 to the controller 406 when the diffuser 404 is inserted through the opening 254 in the receptacle 250, so that an amount or content of oxygen, water, etc. is detected by the controller 406. In some embodiments, the controller 406 is programmed to apply a purge in response to the detected oxygen content or water content in the pod. In some embodiments, the purge is determined by a manufacturing execution system (MES). In some embodiments, the purge is at least one of a vacuum purge, such as in a direction opposite the direction illustrated by arrow 455, or a nitrogen purge, such as in the direction illustrated by arrow 455. In some embodiments, the controller 406 maintains at least one of the oxygen content or the water content at a concentration no greater than 1 parts per million (ppm) in the pod. In some embodiments, maintaining at least one of the oxygen content or the water content at a concentration no greater than 1 ppm inhibits oxidation of wafers within the storage chamber 202. In some embodiments, multiple pipelines 400 are implemented in conjunction with the storage chamber 202, such as in an apparatus 500. In some embodiments, one or more pipelines purge concurrently or not concurrently with one or more other pipelines.

Figure 10:
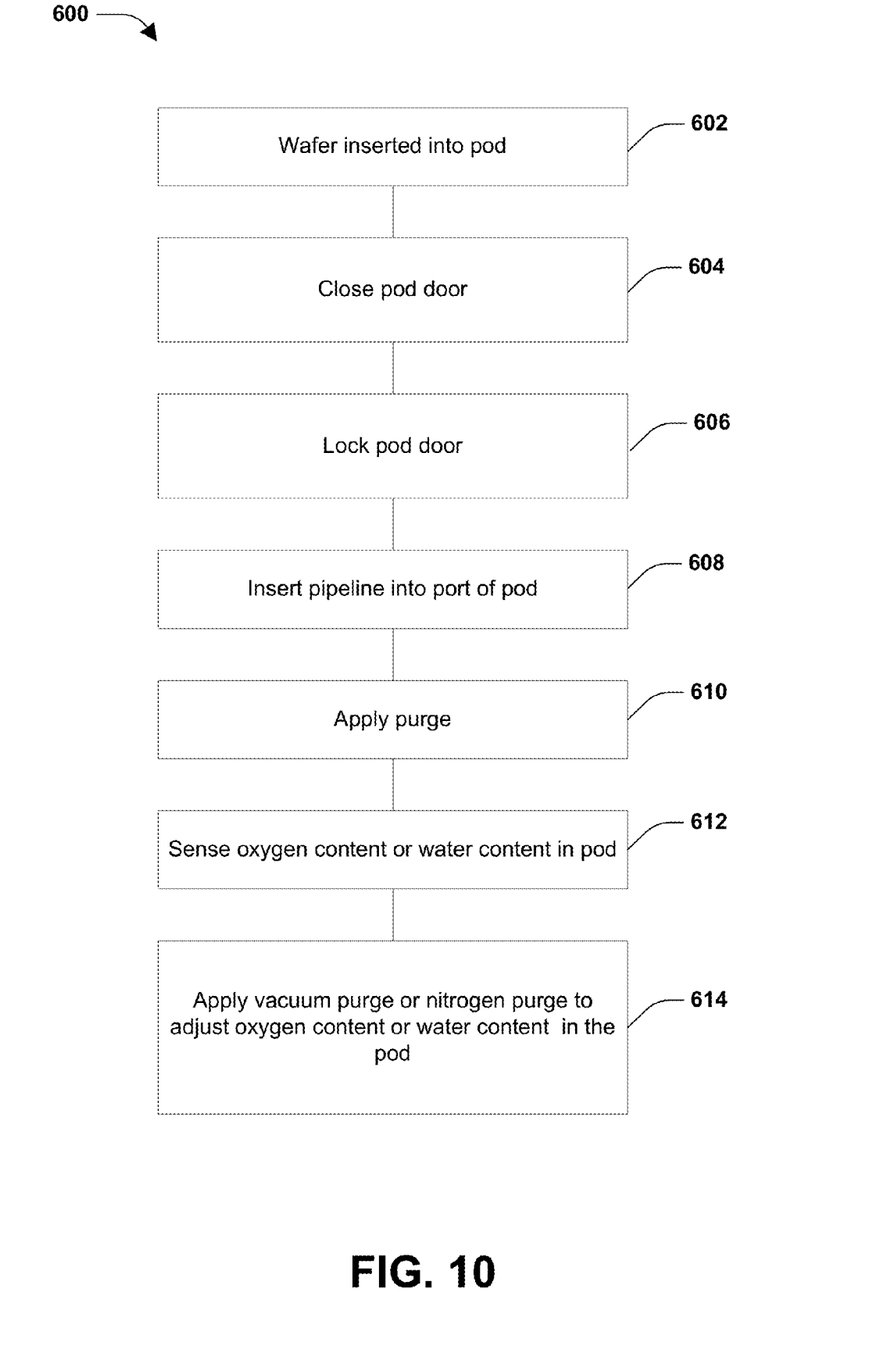
FIG. 10 is a flow diagram illustrating a method of adjusting at least one of an oxygen content or a water content in a pod, according to some embodiments.

A method 600 of adjusting at least one of an oxygen content or a water content in an apparatus, such as apparatus 500 according to some embodiments, is illustrated in FIG. 10. At 602, a wafer is inserted into a storage chamber of a pod. At 604, a pod door is closed. In some embodiments, the pod door is closed by a robot. At 606, the pod door is locked. In some embodiments, a key assembly is actuated to cause a pressure applicator to engage a seal band of the pod door to form a seal between the pod door and a sidewall surface of the storage chamber of the pod. At 608, a first pipeline is inserted into a first port of the pod. In some embodiments, a diffuser attached to a first end of a pipe of the first pipeline is inserted into an opening of a receptacle of a port of a pod. In some embodiments, the first pipeline is inserted into the first port on the base of the pod. At 610, a purge is applied to the storage chamber via the first pipeline. In some embodiments, the purge is at least one of a vacuum purge or a nitrogen purge. In some embodiments, a vacuum purge is applied. In some embodiments, the vacuum purge further facilitates sealing the pod door with or against the sidewall surface of the storage chamber. At 612, at least one of a first oxygen content or a first water content in the pod is sensed. In some embodiments, at least one of the first oxygen content or the first water content in the pod is sensed using a first controller attached to a second end of the pipe. In some embodiments, at least one of the first oxygen content or first water content is communicated to a MES. At 614, at least one of a vacuum purge or a nitrogen purge is applied to adjust at least one of the first oxygen content or the first water content to obtain at least one of a second oxygen content or a second water content in the pod. In some embodiments, the MES determines the purge. In some embodiments, a vacuum purge is applied by a first pipeline and a nitrogen purge is applied by a second pipeline inserted into a second port. In some embodiments, at least one of the second oxygen content or the second water content is less than 1 ppm.

Figure 11:
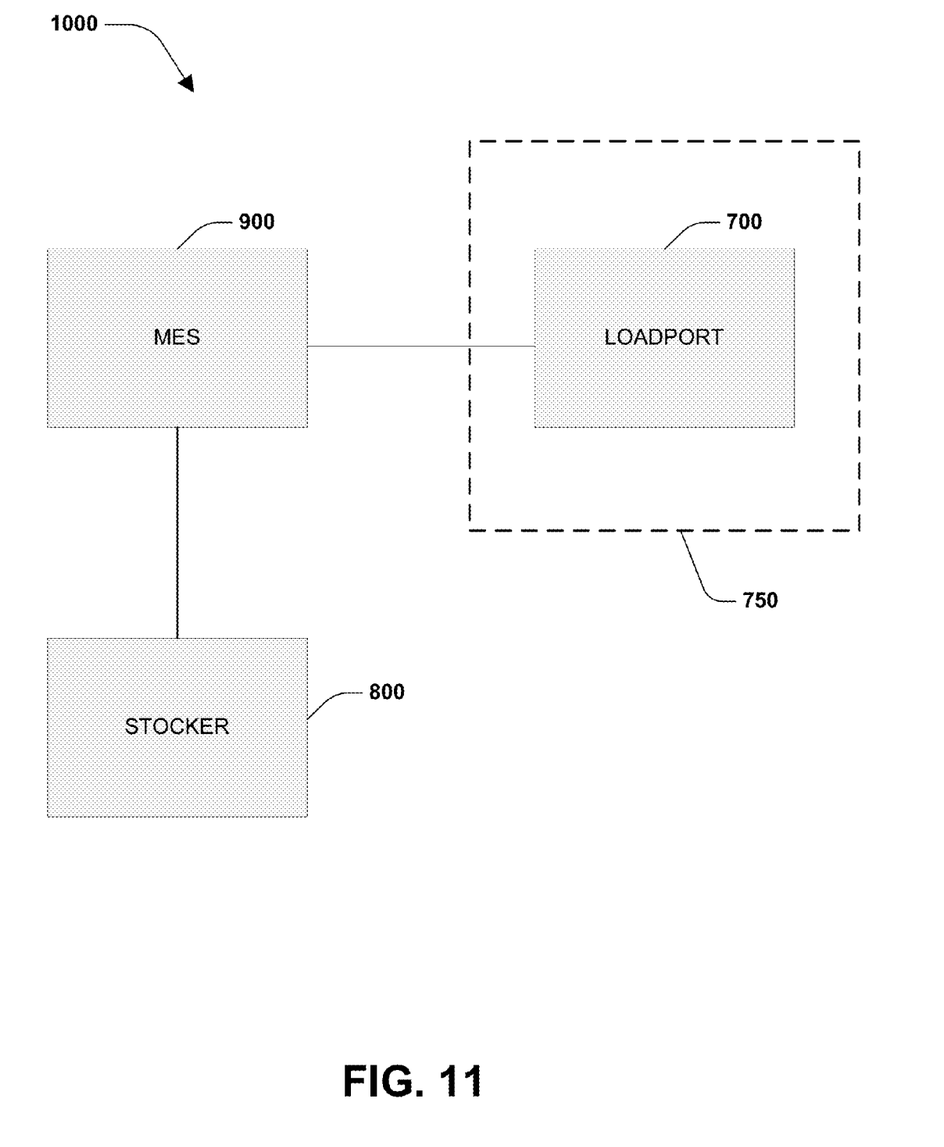
FIG. 11 is an illustration of a system for adjusting at least one of an oxygen content or a water content in a pod, according to some embodiments.

Referring to FIG. 11, illustrated is a system 1000 for adjusting at least one of an oxygen content or a water content in a pod, such as pod 200 during various stages in a manufacturing process. In some embodiments, at least one of a stocker 800 or a loadport 700 receives information about the pod from a MES 900. In some embodiments, the information received includes at least one of an oxygen content, a water content, a wafer number or a wafer slot position in the pod. In some embodiments, the MES 900 receives information including the position of the pod door during processing. In some embodiments, the MES 900 determines a purge program for the pod based upon information received regarding the condition of the pod. In some embodiments, the purge program is determined according to the method 600. In some embodiments, the purge program includes at least one of a vacuum purge or a nitrogen purge. In some embodiments, the purge program determines at least one of a length of time for the purge or a pressure for the purge. In some embodiments, the purge maintains the pressure inside the pod at about 0.01 torr. In some embodiments, the purge program is designed to maintain at least one of the oxygen content or water content at a concentration less than 1 ppm in the pod.

In some embodiments, the stocker 800 receives information about the pod from the MES 900. In some embodiments, at least one of a first oxygen content or a first water content is communicated to the MES 900. In some embodiments, the MES 900 determines a purge program based upon the information the MES 900 receives. In some embodiments, at least one of the first oxygen content or first water content is adjusted in the pod to obtain a second oxygen content or a second water content. In some embodiments, the MES 900 issues an instruction for the pod to be moved from the stocker 800 to the loadport 700 of a processing tool 750. In some embodiments, the loadport 700 receives information about the pod from the MES 900. In some embodiments, a purge program is created based upon information the MES 900 receives. In some embodiments, at least one of the second oxygen content or the second water content is adjusted to obtain at least one of a third oxygen content or a third water content. In some embodiments, the purge program accounts for oxygen, water, etc. introduced into the storage chamber when the pod door is opened or closed to move wafers in or out of the pod for processing by the processing tool 750. In some embodiments, at least one of the third oxygen content or the third water content is maintained at a level below 1 ppm during processing. In some embodiments, the purge program maintains at least one of the third oxygen content or the third water content at a level below 1 ppm in at least one of the pod or the loadport 700. In some embodiments, at least one of the adjusted oxygen content or the adjusted water content inhibits oxidation of wafers stored within the storage chamber during at least one of storage, transportation or processing.

In some embodiments, an apparatus is provided. In some embodiments, the apparatus comprises a pod and a pipeline. In some embodiments, the pod comprises a storage chamber and a port. In some embodiments, the port comprises a receptacle having a first opening and a constraining ring proximate the first opening. In some embodiments, the pipeline comprises a pipe, a diffuser attached to a first end of the pipe and a controller attached to a second end of the pipe.

In some embodiments, an apparatus is provided. In some embodiments, the apparatus comprises a pod and a pipeline. In some embodiments, the pod comprises a storage chamber and a port. In some embodiments, a HEPA filter is located between the storage chamber and the port. In some embodiments, the port comprises a receptacle having a first opening and a constraining ring proximate to the first opening. In some embodiments, the pipeline comprises a pipe, a diffuser and a controller. In some embodiments, the diffuser is attached to a first end of the pipe and the controller is attached to the second end of the pipe. In some embodiments, the first opening is dimensioned to accommodate the diffuser.

In some embodiments, a method of adjusting at least one of oxygen content or water content in a pod is provided. In some embodiments, the method comprises inserting a diffuser attached to a first end of a pipe of a pipeline into a first opening of a receptacle of a first port of the pod. In some embodiments, the method comprises sensing at least one of a first oxygen content or a first water content in the pod using a first controller attached to a second end of the pipe. In some embodiments, the method comprises applying at least one of a vacuum purge or a nitrogen purge to adjust at least one of the first oxygen content or the first water content to obtain at least one of a second oxygen content or a second water content in the pod.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

The invention claimed is:

1. An apparatus comprising:
   a pod, comprising:
      a storage chamber comprising a set of walls defining an interior region in which wafers are held, wherein a first wall of the set of walls defines a first opening;
      a receptacle disposed within the interior region and defining a second opening overlying the first opening; and
      a constraining ring disposed within the interior region and surrounding a portion of the receptacle defining the second opening and applying pressure on the receptacle to seal the second opening; and
   a pipeline comprising:
      a pipe;
      a diffuser attached to a first end of the pipe and dimensioned for insertion into the storage chamber through the first opening and the second opening; and
      a controller attached to a second end of the pipe.

2. The apparatus of claim 1, wherein the receptacle comprises silicon.

3. The apparatus of claim 1, comprising an air filter disposed within the interior region, the receptacle disposed between the air filter and the first opening.

4. The apparatus of claim 1, wherein the controller comprises at least one of:
   a mass flow controller;
   a vacuum controller;
   an oxygen detector; or
   a water detector.

5. The apparatus of claim 1, comprising a stopper surrounding the pipe.

6. The apparatus of claim 5, wherein the stopper seals the first opening upon being mated with the first wall.

7. The apparatus of claim 1, wherein the pod is a front-opening unified pod (FOUP).

8. An apparatus comprising:
   a pod, comprising:
      a storage chamber comprising a set of walls defining an interior region in which wafers are held;
      a receptacle disposed within the interior region and defining a first opening; and
      a constraining ring disposed within the interior region and pinching the receptacle to seal the first opening; and
   a pipeline comprising:
      a pipe;
      a diffuser attached to a first end of the pipe, the first opening dimensioned to accommodate the diffuser; and
      a controller attached to a second end of the pipe.

9. The apparatus of claim 8, wherein the receptacle comprises silicon.

10. The apparatus of claim 8, wherein the controller comprises at least one of:
   a mass flow controller;
   a vacuum controller;
   an oxygen detector; or
   a water detector.

11. The apparatus of claim 8, comprising a stopper surrounding the pipe, the stopper dimensioned to form a seal with a first wall of the set of walls.

12. The apparatus of claim 8, wherein the constraining ring is expandable to enable the diffuser to selectively penetrate the first opening.

13. The apparatus of claim 8, wherein the pod is a front-opening unified pod (FOUP).

14. A method of adjusting at least one of oxygen content or water content in a pod comprising:
   inserting a diffuser attached to a first end of a pipe of a pipeline into a first opening of a receptacle disposed within an interior region of the pod and overlying an opening defined within a wall of the pod, wherein the inserting causes a constraining ring disposed within the interior region to expand to create a seal between the receptacle and at least one of the pipe or the diffuser;
   sensing at least one of a first oxygen content or a first water content in the pod using a first controller attached to a second end of the pipe; and
   applying at least one of a vacuum purge or a nitrogen purge to adjust at least one of the first oxygen content or the first water content to obtain at least one of a second oxygen content or a second water content in the pod.

15. The method of claim 14, comprising:
   inserting a second diffuser attached to a first end of a second pipe of a second pipeline into a second opening of a second receptacle disposed within the interior region of the pod.

16. The method of claim 15, comprising applying the nitrogen purge using the pipeline and applying the vacuum purge using the second pipeline.

17. The method of claim 14, wherein at least one of the second oxygen content or the second water content is less than 1 ppm.

18. The method of claim 14, comprising transferring the pod from a stocker to a loadport after obtaining at least one of the second oxygen content or the second water content in the pod.

19. The method of claim 18, comprising adjusting at least one of the second oxygen content or the second water content to obtain at least one of a third oxygen content or a third water content in the pod based upon a communication from at least one of the stocker or the loadport to a manufacturing execution system (MES).

20. The method of 19, wherein at least one of the third oxygen content or the third water content less than 1 ppm.

* * * * *